United States Patent
Johnson et al.

(10) Patent No.: US 7,718,016 B2
(45) Date of Patent: May 18, 2010

(54) METHODS OF MAKING MULTILAYERED, HYDROGEN-CONTAINING INTERMETALLIC STRUCTURES

(75) Inventors: James Neil Johnson, Scotia, NY (US); Ilissa Brooke Schild, Saratoga Springs, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 232 days.

(21) Appl. No.: 11/399,392

(22) Filed: Apr. 7, 2006

(65) Prior Publication Data

US 2010/0080934 A1   Apr. 1, 2010

(51) Int. Cl.
*C22F 1/00* (2006.01)

(52) U.S. Cl. ..................................... 148/535
(58) Field of Classification Search ................... 148/535
See application file for complete search history.

(56) References Cited

U.S. PATENT DOCUMENTS

| | | | |
|---|---|---|---|
| 6,382,105 B1 | 5/2002 | Jones | |
| 6,443,789 B2 | 9/2002 | Tominetti et al. | |
| 6,597,850 B2 | 7/2003 | Andrieu et al. | |
| 6,682,817 B1 | 1/2004 | della Porta et al. | |
| 6,720,204 B2 | 4/2004 | Sudijono et al. | |
| 6,991,860 B2 * | 1/2006 | Phillips et al. | 428/704 |
| 2003/0203105 A1 | 10/2003 | Porta et al. | |
| 2004/0101686 A1 | 5/2004 | Porta et al. | |

OTHER PUBLICATIONS

S.H. Fischer and M.C. Grubelich, "A Survey of Combustible Metals, Thermites, and Intermetallics for Pyrotechnic Applications," American Institute of Aeronautics and Astronautics, Inc., AIAA Meeting Papers on Disc, Jul. 1996, pp. 1-13.

L.Q. Shi et al., "Investigation of the Hydrogenation Properties of Zr Films Under Unclean Plasma Conditions," J. Vac. Sci. Technol. A 20(6), Nov./Dec. 2002, pp. 1840-1845, American Vacuum Society.

* cited by examiner

*Primary Examiner*—Roy King
*Assistant Examiner*—Jie Yang
(74) *Attorney, Agent, or Firm*—Buchanan Ingersoll & Rooney PC

(57) ABSTRACT

Methods of making multilayered, hydrogen-containing intermetallic structures including at least two adjacent metal layers are disclosed. At least one of the metal layers contains hydrogen, which can be introduced into the metal by plasma hydrogenation. The intermetallic structures can have high hydrogen contents and micrometer-sized and nanometer-sized dimensions.

28 Claims, 3 Drawing Sheets

METHODS OF MAKING MULTILAYERED, HYDROGEN-CONTAINING INTERMETALLIC STRUCTURES

BACKGROUND

Intermetallic reactions involve the release of thermal energy through an exothermic reaction between two different metallic elements. Intermetallic reactions can produce solid, liquid and/or gaseous products. Metals that undergo Intermetallic reactions can be used, for example, in additives to propellants, thermal battery heat sources, and ignition aids.

SUMMARY

Methods of making multilayered, hydrogen-containing intermetallic structures are provided. An exemplary embodiment of the methods comprises depositing a first metal layer; depositing a second metal layer, the first and second metal layers contacting each other and having respective compositions effective to undergo an intermetallic reaction when activated; and introducing hydrogen into at least one of the first and second metal layers by plasma hydrogenation.

Another exemplary embodiment of the methods of making a multilayered, hydrogen-containing intermetallic structure comprises depositing a first metal layer; depositing a second metal layer, the first and second metal layers contacting each other and having respective compositions effective to undergo a first intermetallic reaction when activated; depositing a third metal layer; depositing a fourth metal layer; the third and fourth metal layers contacting each other and having respective compositions effective to undergo a second intermetallic reaction when activated; and introducing hydrogen into at least one of the first, second, third and fourth metal layers by plasma hydrogenation; wherein each of the first, second, third and fourth metal layers has a thickness of less than about 100 nm.

Another exemplary embodiment of the methods of making a multilayered, hydrogen-containing intermetallic structure comprises depositing a plurality of metal layers to form an intermetallic structure, the intermetallic structure including at least two adjacent metal layers having respective compositions effective to undergo an intermetallic reaction when activated; and introducing hydrogen into at least one metal layer by plasma hydrogenation; wherein each of the metal layers has a thickness of less than about 100 nm.

DETAILED DESCRIPTION

Multilayered, hydrogen-containing intermetallic structures that can be made by exemplary embodiments of the methods of making multilayered hydrogen-containing intermetallic structures described herein include two or more metals that have respective compositions effective to undergo one or more intermetallic reactions with each other when the structures are activated. As used herein, the term "activated" means to ignite by any suitable technique, such as by using a thermal impulse, an exploding bridge wire, a semiconductor bridge igniter, laser impingement, mechanical methods, and the like. When activated, two or more metals of the multilayered intermetallic structure mix and undergo an intermetallic reaction, thereby releasing energy and producing a reaction product. The reaction products of the intermetallic reactions can be solids, liquids and/or gases.

One or more, or all, of the metal layers of the multilayered intermetallic structures contains hydrogen. Hydrogen contained in the intermetallic structures is released in gaseous form when the structures are activated. Because the metal layers contain hydrogen, the multilayered intermetallic structures can release a greater amount of heat when activated as compared to structures that do not contain this hydrogen. The metal layers of the intermetallic structures can have substantially the same or different hydrogen contents from each other.

The multilayered intermetallic structures can have micron-sized or smaller, nano-sized dimensions. By having such small dimensions, the distance between the metallic reactants of one or more intermetallic reactions is decreased in the structures as compared to larger structures and, consequently, energy can be released more rapidly from the intermetallic structures when they are activated. The intermetallic structures can rapidly release a high amount of energy per unit volume of the structures when activated.

Figure 1:
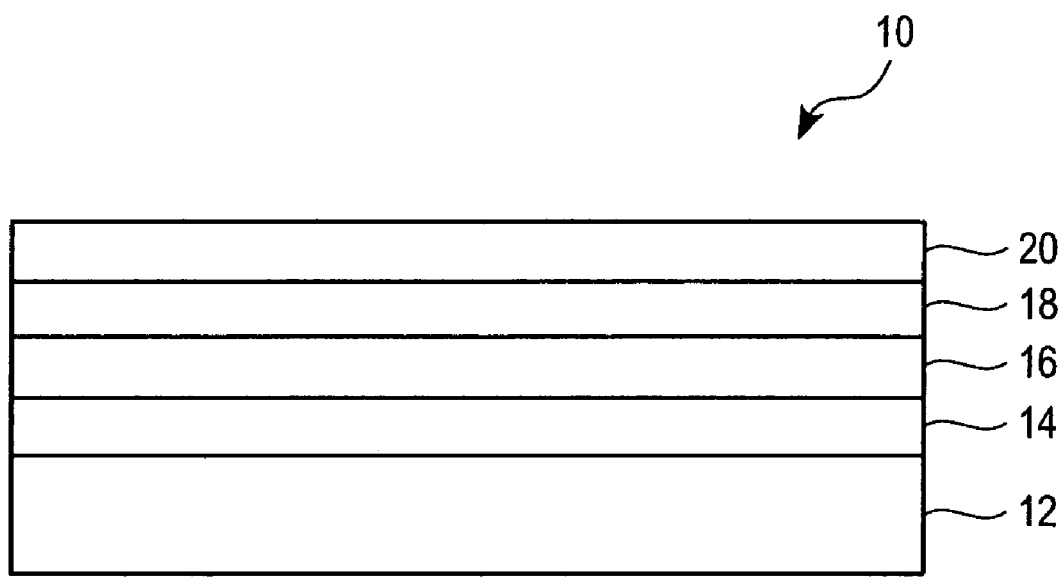
FIG. 1 illustrates an exemplary embodiment of a multilayered intermetallic structure.

FIG. 1 illustrates an exemplary embodiment of a multilayered intermetallic structure 10 that can be made by the methods described herein. The multilayered intermetallic structure 10 includes a substrate 12, a first metal layer 14 adjacent the substrate 12, a second metal oxide layer 16 adjacent the first metal layer 14, a third metal layer 18 adjacent the second metal layer 16, and a fourth metal layer 20 adjacent the third metal layer 18. In an exemplary embodiment, each of the metal layers 14, 16, 18 and 20 can contain hydrogen. In another exemplary embodiment, only the metal layers 14, 18, or the metal layers 16, 20, contain hydrogen. Other embodiments of the multilayered structures can include less than 4 total layers, e.g., 2 layers, or more than 4 total layers, such as 10, 50, 100, 500, 1000 or more layers.

In an exemplary embodiment, the metal layers of the multilayered intermetallic structure can have a maximum total thickness of about 100 µm, such as about 50 µm, about 10 µm, about 1 µm, or about 100 nm. The individual metal layers of the multilayered intermetallic structures can have a thickness less than about 100 nm, such as less than about 75 nm, less than about 50 nm, less than about 30 nm, or less than about 10 nm. The metal layers can have the same or different thicknesses from each other in embodiments of the intermetallic structures.

In an exemplary embodiment of the multilayered intermetallic structure 10, the first metal layer 14 and the third metal layer 18 are composed of the same first metal, and the second metal layer 16 and the fourth metal layer 20 are composed of the same second metal, where the first and second metal compositions can undergo an intermetallic reaction with each other when the structure is activated.

In another exemplary embodiment of the multilayered intermetallic structure 10, the first metal layer 14 and the third metal layer 18 are composed of the same first metal, the second metal layer 16 is composed of a different second metal, and the fourth metal layer 20 is composed of a different third metal, where the first and second metals have compositions that are effective to undergo a first intermetallic reaction with each other, and the first and third metals have compositions that are effective to undergo a second intermetallic reaction with each other. This exemplary arrangement of metal layers can be repeated any desired number of times to produce a multilayered intermetallic structure including additional layers of the first, second and third metals.

Accordingly, embodiments of the multilayered intermetallic structure that can be made by embodiments of the methods can include layers of various combinations of metals that are effective to undergo a single intermetallic reaction, or various combinations of metals that are effective to undergo two or more different intermetallic reactions, when the structures are activated.

The metals that are used to form the multilayered intermetallic structures can be selected based on being effective to undergo one or more intermetallic reactions having a sufficiently high heat of reaction to release a desirably high amount of energy. The metals of the metal layers are preferably, but are not limited to, pure materials. Thermodynamic values for intermetallic reactions are given in S. H. Fischer and M. C. Grubelich, "A survey of combustible metals, thermites, and intermetallics for pyrotechnic applications," American Institute of Aeronautics and Astronautics, Inc., AIAA Meeting Papers on Disc, July 1996, pp. 1-13. Exemplary embodiments of the multilayered structure can include one or more of the following pairs of metals arranged in an alternating layered structure: Ti/B, C/Ti, C/Zr and Zn/Zr. These pairs of metals undergo the following intermetallic reactions with the corresponding heats of reaction, –Q, based on mass and volume of the reactants:

(a) Ti/B: (1) B+Ti (–Q=652.2 cal/g or 2558 cal/cm$^3$); and (2) 2B+Ti (–Q=1318 cal/g or 5170 cal/cm$^3$);

(b) C/Ti: C+Ti (–Q=736.1 cal/g or 2765 cal/cm$^3$);

(c) C/Zr: C+Zr (–Q=455.3 cal/g or 2402 cal/cm$^3$); and (d) Zn/Zr: 2Zn+Zr (–Q=170 cal/g or 1165 cal/cm$^3$).

In an exemplary embodiment, the multilayered structure includes alternating layers of Ti/B or C/Ti, which are effective to undergo an intermetallic reaction (e.g., intermetallic reaction (a)(1) and/or (a)(2) and intermetallic reaction (c), respectively. In another exemplary embodiment, the multilayered structure includes alternating layers of B/Ti/C/Ti, where B and Ti and C and Ti, respectively, are effective to undergo at least two different intermetallic reactions with each other. In another exemplary embodiment, the multilayered structure includes alternating layers of C/Zr or Zn/Zr, which can undergo the intermetallic reactions (c) and (d), respectively. In yet another exemplary embodiment, the multilayer structure includes alternating layers of C/Zr/Zn/Zr, where C and Zr and Zn and Zr, respectively, are effective to undergo two different intermetallic reactions.

The metal layers of the multilayer structures can be deposited on any suitable substrate material. For example, the substrate can be composed of a metal, ceramic, glass, semiconductor or polymer material, or a combination of two or more of these materials. The substrate can have any suitable shape and size, such as a tube, sheet, or the like. The multilayered intermetallic structures can be formed on one or more selected surfaces and/or surface regions of the substrate. The substrate is preferably retained as part of the multilayer structure. In another exemplary embodiment, the substrate can be removed after forming the multilayer structure.

The metal layers of the multilayer structure can be deposited by any suitable metal deposition technique(s). For example, the metal layers can be deposited by chemical vapor deposition (CVD), low-pressure chemical vapor deposition (LPCVD), plasma enhanced chemical vapor deposition (PECVD), sputtering, and the like. The deposition technique that is utilized to deposit the metal layers of a particular intermetallic structure can be selected based on various factors, such as the particular metal layer composition that is deposited.

The metal layers of the multilayer structure can be deposited in the same reaction chamber, or alternatively the metal layers can be deposited in different reaction chambers (e.g., in a deposition tool including multiple interconnected process chambers). For example, metal layers of different metals can be deposited in the same reaction chamber by sputter deposition using a multi-material target, e.g., a target including regions of the different metals that are sputtered.

According to exemplary embodiments of the methods, the multilayered intermetallic structure is preferably subjected to plasma hydrogenation to introduce hydrogen into at least one of the metal layers. In an exemplary embodiment, the multilayered structure is treated to introduce hydrogen into each of the metal layers that are composed of one of the metals (e.g., of Ti or Zr). In another exemplary embodiment, the multilayered structure is treated to introduce hydrogen into each of the layers of the multilayer structure.

During plasma hydrogenation, a structure including at least one deposited metal layer can be placed in a plasma reaction chamber connected to a hydrogen (e.g., $H_2$) gas source. A power source is activated to energize the hydrogen to generate hydrogen plasma in the reaction chamber. For example, the power source can supply RF power, microwaves, or like. RF power can be inductively coupled to the hydrogen gas using a coil, or power can be capacitively coupled to the hydrogen gas using a parallel-plate electrode arrangement. The RF input power can be, e.g., from about 200 W to about 600 W to generate plasma. The input power can be supplied at a frequency of about 100 kHz to about 2.45 GHz. The substrate can be heated to a temperature above ambient temperature in the plasma reaction chamber, e.g., from about 50° C. to about 125° C. during the plasma hydrogenation treatment. Hydrogen gas is supplied to the plasma reaction chamber at a suitable flow rate, such as from about 50 sccm to about 500 sccm. The plasma reaction chamber is maintained at a desired pressure during processing of the multilayer structure, e.g., from about 10 to about 1000 mTorr.

The hydrogen plasma is effective to introduce hydrogen into at least one metal that forms one or more metal layers of the multilayered intermetallic structure. Depending on the composition of the substrate, the hydrogen can also be introduced into the substrate during the plasma hydrogenation treatment. For example, the substrate can be composed of a metal that can be plasma hydrogenated, such as Zr or Ti, which can also be used to form metal layers of the structure. The plasma hydrogenation treatment is continued for an amount of time that is effective to produce a desired hydrogen concentration in one or more of the metal layers and optionally also in the substrate. For example, the average hydrogen content in one or more of the metal layers and optionally in the substrate can be at least 50 at %, and preferably from about 50 at % to about 70 at %. By varying the plasma hydrogenation process conditions, different hydrogen profiles in the metal layers can be produced.

Plasma hydrogenation can introduce hydrogen into metal layers of the multilayer structure such that the as-introduced hydrogen sits interstitially in the metal(s). In this manner, the multilayered intermetallic structure can have high energy content without sacrificing volume. To facilitate plasma hydrogenation, the hydrogen plasma can remove surface oxide layers on the metal layers by the formation of OH and $H_2O$, organic residues can be extracted due to reaction with atomic hydrogen, radiation and plasma heating can enhance surface activation of the metal layers, hydrogen can diffuse rapidly in selected metals, and ion species crossing the plasma sheath are implanted into near-surface regions of the metal layers.

In an exemplary embodiment, the intermetallic structures can be subjected to plasma hydrogenation after each metal layer is deposited so that the surface area of the last-deposited metal layer that is exposed to the plasma is enhanced. In another exemplary embodiment, the intermetallic structure can be subjected to plasma hydrogenation each time that a selected number of metal layers, e.g., 10 metal layers, have been deposited. In yet another exemplary embodiment, the intermetallic structure can be subjected to plasma hydrogenation a single time after all of the metal layers have been deposited.

The hydrogen content of the metal layers of the multilayered intermetallic structures can be characterized using Nuclear Reaction Analysis (NRA), for example. The NRA technique provides depth profiling of hydrogen near a sample surface using a mass 15 nitrogen beam. In this technique, a sample is placed in a vacuum test chamber at a base pressure of at least about $1\times10^{-5}$ Torr. A beam of nitrogen having an energy level of at least 6.38 MeV is directed into the sample. Gamma ray output (due to the presence of hydrogen in the sample) is measured with a bismuth germanium oxide (BGO) scintillation detector. Using a parameter of the pre-calibrated chamber, the flux of gamma rays at each energy step is converted to a measurement of hydrogen concentration in the sample. To convert raw data (counts vs. energy) to H concentration vs. depth of the sample, the stopping power of mass 15 nitrogen ions in the sample materials is determined. Stopping power values are reported in J. F. Ziegler, J. P. Biersack and U. Littmark, *Stopping Powers and Ranges of Ions in Solids*, Vol. 1, Pergamon Press, New York (1985).

Example

Ti and Zr films are separately deposited to a thickness of about 100 nm by sputter deposition on separate silicon substrates. The substrates are then simultaneously exposed to hydrogen plasma in a plasma reaction chamber using the following processing conditions: substrate temperature/85° C., $H_2$ flow rate/100 sccm, chamber pressure/25 mTorr, RF power/300 W, exposure time/10 min.

Figure 2:
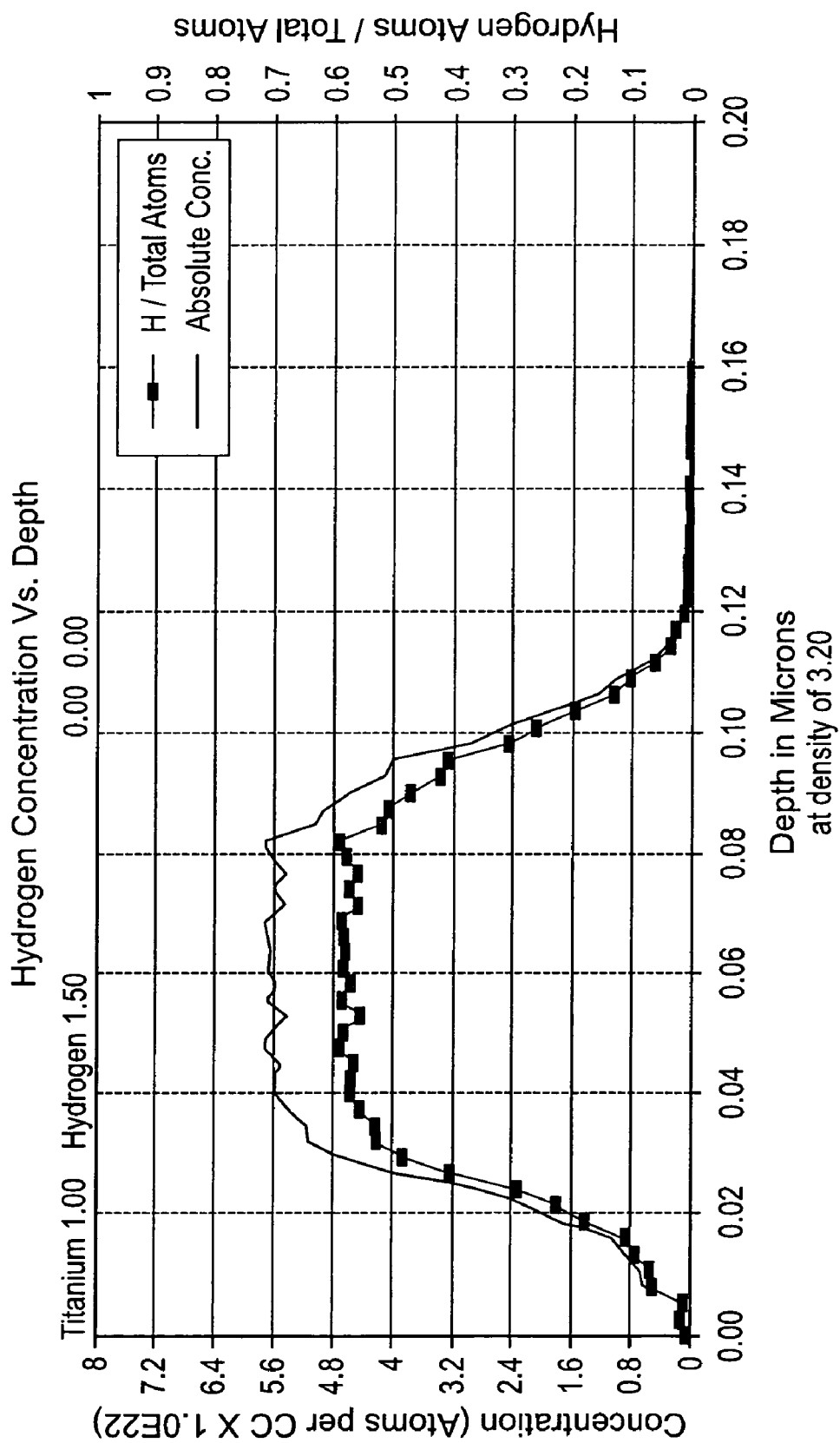
FIG. 2 shows the absolute concentration of hydrogen, and the ratio of hydrogen atoms/total atoms versus depth from a surface of a plasma hydrogenated titanium layer.
Figure 3:
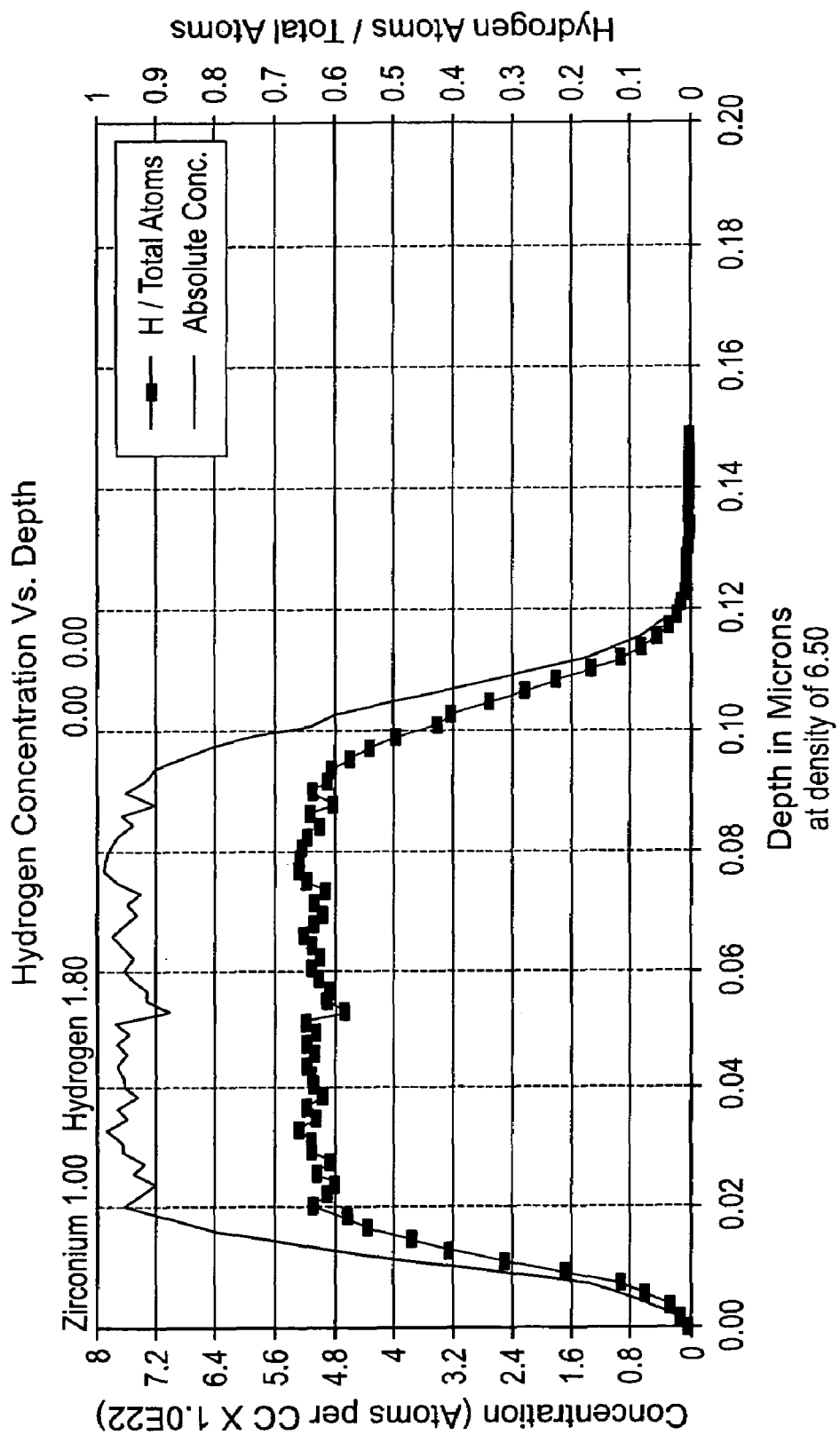
FIG. 3 shows the ratio of hydrogen atoms/total atoms versus depth from layer surface of a plasma hydrogenated zirconium layer.

The hydrogen content of each of the as-deposited metal films is measured by NRA. FIGS. 2 and 3 show the hydrogen concentration versus depth profiles of the Ti and Zr films, respectively. As shown, the Ti and Zr films have an average 58 at % and 65 at % hydrogen concentration, respectively. These test results demonstrate that highly hydrogenated metal film structures can be produced using plasma hydrogenation.

The multilayered intermetallic structures can be used in applications in which their ability to rapidly release high amounts of reaction energy per unit volume of the energetic material are desirable. The compositions of the metal layers can be selected to provide desired intermetallic reactions that release a desired amount of energy and produce desired reaction products. The selected metal compositions can have high activation temperatures to provide stability to temperature fluctuations, shock and environmental effects.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A method of making a multilayered, hydrogen-containing intermetallic structure that releases thermal energy and produces a reaction product upon activation through an intermetallic reaction, the method comprising:
   depositing a first layer;
   depositing a second layer, the first and second layers contacting each other and having respective compositions effective to undergo an intermetallic reaction when activated; and
   introducing hydrogen into at least one of the first and second layers by plasma hydrogenation;
   wherein the first and second layers are selected from the group consisting of:
   a first layer of elemental Ti, and a second layer of elemental B;
   a first layer of elemental C, and a second layer of elemental Ti;
   a first layer of elemental C, and a second layer of elemental Zr; and
   a first layer of elemental Zn, and a second layer of elemental Zr.

2. The method of claim 1, wherein one of the first and second layers is subjected to plasma hydrogenation before the other one of the first and second layers is deposited.

3. The method of claim 1, wherein at least one of the first and second layers has an average hydrogen concentration of at least about 50 at % after the plasma hydrogenation.

4. The method of claim 3, wherein at least one of the first and second layers has an average hydrogen concentration of at least about 60 at % after the plasma hydrogenation.

5. The method of claim 1, wherein the first layer or the second layer is deposited on a substrate of a material selected from the group consisting of metals, ceramics, glasses, semiconductors, polymers and combinations thereof.

6. The method of claim 5, wherein:
   the substrate is of a metal; and
   the method further comprises introducing hydrogen into the substrate by plasma hydrogenation.

7. The method of claim 1, wherein each of the first and second layers has a thickness of less than about 100 nm.

8. The method of claim 7, wherein each of the first and second layers has a thickness of less than about 10 nm.

9. The method of claim 1, wherein the hydrogen introduced by plasma hydrogenation sits interstitially in the at least one of the first and second layers.

10. The method of claim 1, wherein each of the layers has a thickness of about 10 nm to about 100 nm.

11. A method of making a multilayered, hydrogen-containing intermetallic structure, the method comprising:
    depositing a first layer;
    depositing a second layer, the first and second layers contacting each other and having respective compositions effective to undergo a first intermetallic reaction when activated;
    depositing a third layer;
    depositing a fourth layer, the third and fourth layers contacting each other and having respective compositions effective to undergo a second intermetallic reaction when activated;
    wherein the first and second layers and the third and fourth layers, respectively, are of an alternating layer structure of elements selected from the group consisting of:
    elemental Ti, and elemental B;

elemental C, and elemental Ti;
elemental C, and elemental Zr; and
elemental Zn, and elemental Zr,
introducing hydrogen into at least one of the first, second, third and fourth layers by plasma hydrogenation;
wherein each of the first, second, third and fourth layers has a thickness of about 10 nm to about 100 nm.

12. The method of claim 11, wherein each of the first, second, third and fourth layers is subjected to plasma hydrogenation.

13. The method of claim 12, wherein the first, second and third layers, respectively, are subjected to plasma hydrogenation before the second, third and fourth layers, respectively, are deposited.

14. The method of claim 11, wherein at least one of the first, second, third and fourth layers has an average hydrogen concentration of at least about 50 at % after the plasma hydrogenation.

15. The method of claim 14, wherein at least one of the first, second, third and fourth layers has an average hydrogen concentration of at least about 60 at % after the plasma hydrogenation.

16. The method of claim 11, wherein one of the first, second, third and fourth is deposited on a substrate of a material selected from the group consisting of metals, ceramics, glasses, semiconductors, polymers and combinations thereof.

17. The method of claim 16, wherein:
the substrate is of a metal; and
the method further comprises introducing hydrogen into the substrate by plasma hydrogenation.

18. The method of claim 11, wherein the hydrogen introduced by plasma hydrogenation sits interstitially in the at least one of the first, second, third and fourth layers.

19. A method of making a multilayered, hydrogen-containing intermetallic structure, the method comprising:
depositing a plurality of layers to form an intermetallic structure, the intermetallic structure including at least two adjacent layers having respective compositions effective to undergo an intermetallic reaction when activated; and
wherein the intermetallic structure comprises adjacent layers of an alternating layer structure of elements selected from the group consisting of:
elemental Ti, and elemental B;
elemental C, and elemental Ti;
elemental C, and elemental Zr; and
elemental Zn, and elemental Zr,
introducing hydrogen into at least one layer by plasma hydrogenation;
wherein each of the layers has a thickness of about 10 nm to about 100 nm.

20. The method of claim 19, wherein the intermetallic structure is subjected to plasma hydrogenation before all layers have been deposited.

21. The method of claim 19, wherein the intermetallic structure is subjected to plasma hydrogenation after all layers have been deposited.

22. The method of claim 19, wherein at least one layer has an average hydrogen concentration of at least about 60 at % after the plasma hydrogenation.

23. The method of claim 19, wherein one of the layers is deposited on a substrate of a material selected from the group consisting of metals, ceramics, glasses, semiconductors, polymers and combinations thereof.

24. The method of claim 23, wherein:
the substrate is of a metal; and
the method further comprises introducing hydrogen into the substrate by plasma hydrogenation.

25. The method of claim 19, wherein the intermetallic structure comprises at least 10 layers.

26. The method of claim 19, wherein the intermetallic structure comprises at least 100 layers.

27. The method of claim 19, wherein the intermetallic structure comprises at least 1000 layers.

28. The method of claim 19, wherein the intermetallic structure comprises layers having compositions effective to undergo at least two different intermetallic reactions when activated.

* * * * *